US010993315B2

(12) United States Patent
Timmins et al.

(10) Patent No.: US 10,993,315 B2
(45) Date of Patent: Apr. 27, 2021

(54) PRINTED CIRCUIT VIA FOR KA SATCOM CIRCUIT BOARDS

(71) Applicant: AvL Technologies, Inc., Asheville, NC (US)

(72) Inventors: Ian J. Timmins, Asheville, NC (US); Keith Edenfield, Weaverville, NC (US); Bruce Barratt, Asheville, NC (US); Alan Ellis, Candler, NC (US)

(73) Assignee: AvL Technologies, Inc., Asheville, NC (US)

( * ) Notice: Subject to any disclaimer, the term of this patent is extended or adjusted under 35 U.S.C. 154(b) by 115 days.

(21) Appl. No.: 16/176,737

(22) Filed: Oct. 31, 2018

(65) Prior Publication Data

US 2019/0132943 A1     May 2, 2019

Related U.S. Application Data

(60) Provisional application No. 62/579,605, filed on Oct. 31, 2017.

(51) Int. Cl.
    *H05K 1/02*         (2006.01)
    *H05K 1/11*         (2006.01)

(52) U.S. Cl.
CPC .......... *H05K 1/0251* (2013.01); *H05K 1/024* (2013.01); *H05K 1/0242* (2013.01); *H05K 1/116* (2013.01); *H05K 2201/093* (2013.01); *H05K 2201/09609* (2013.01); *H05K 2201/09618* (2013.01); *H05K 2201/09672* (2013.01); *H05K 2201/09727* (2013.01)

(58) Field of Classification Search
CPC .... H05K 1/024; H05K 1/0242; H05K 1/0251; H05K 1/116; H05K 2201/093; H05K 2201/09609; H05K 2201/09618; H05K 2201/09672; H05K 2201/09727
See application file for complete search history.

(56) References Cited

U.S. PATENT DOCUMENTS

| | | | |
|---|---|---|---|
| 6,366,466 B1 * | 4/2002 | Leddige | H05K 1/0251 |
| | | | 174/261 |
| 2004/0176938 A1 * | 9/2004 | Gisin | G06F 30/367 |
| | | | 703/14 |
| 2004/0263181 A1 * | 12/2004 | Ye | G01R 31/2818 |
| | | | 324/534 |

(Continued)

*Primary Examiner* — Timothy J Thompson
*Assistant Examiner* — Rhadames Alonzo Miller
(74) *Attorney, Agent, or Firm* — William G. Heedy; The Van Winkle Law Firm (57) ABSTRACT

A compensated via structure is utilized in a multi-layer printed circuit board (PCB) stackup to improve the radio frequency (RF) transmission performance of the PCB. The compensated via structure includes a compensating structure and a central via surrounded by multiple grounding posts, wherein both ends of the central via are connected to the input and the output transmission lines through pads. The compensating structure is within a ground plane located in between of the two layers within which the input and output transmission lines are. The increased coupling between the central via and the grounding posts and between the compensating structure and the ground plane results in reductions in both return and insertion losses and contributes to the improved RF transmission performance.

12 Claims, 8 Drawing Sheets

(56) References Cited

U.S. PATENT DOCUMENTS

| | | | |
|---|---|---|---|
| 2007/0075405 A1* | 4/2007 | Ye | H01L 23/49838 257/666 |
| 2009/0056999 A1* | 3/2009 | Kashiwakura | H05K 1/116 174/262 |
| 2009/0188711 A1* | 7/2009 | Ahmad | H05K 1/0253 174/262 |
| 2009/0207080 A1* | 8/2009 | Floyd | H01L 23/66 343/700 MS |
| 2009/0256752 A1* | 10/2009 | Akkermans | H01Q 21/061 343/700 MS |
| 2010/0001906 A1* | 1/2010 | Akkermans | H01L 23/66 343/700 MS |
| 2010/0190464 A1* | 7/2010 | Chen | H01Q 9/0407 455/334 |
| 2010/0327068 A1* | 12/2010 | Chen | H01L 23/66 235/492 |
| 2011/0279190 A1* | 11/2011 | Liu | H01P 5/085 333/35 |
| 2013/0056255 A1* | 3/2013 | Biddle | H05K 1/0245 174/266 |
| 2014/0326495 A1* | 11/2014 | Paniagua | H05K 1/116 174/266 |
| 2015/0114706 A1* | 4/2015 | Rose | H05K 1/024 174/262 |

* cited by examiner

PRINTED CIRCUIT VIA FOR KA SATCOM CIRCUIT BOARDS

RELATED APPLICATION

This application claims priority to and incorporates entirely by reference U.S. Provisional Patent Application Ser. No. 62/579,605 filed on Oct. 31, 2017.

FIELD OF THE INVENTION

This invention relates to a printed circuit board (PCB) design for loss reduction in radio frequency (RF) applications. Particularly, this invention presents a compensated via structure for offsetting the elongated effects of vias through a multilayer PCB stackup. The compensating structure of the via structure is contained in a ground plane and includes: (1) an antipad through which a signal via passes between two layers within which the input and output transmission lines are; and (2) at least one additional antipad through which the surrounding vias pass. Additional compensating structures may be utilized in other ground planes between two layers within which the input and output transmission lines are.

BACKGROUND OF THE INVENTION

PCB transmission lines are widely used in high-speed and high-frequency signal transmission. Vias, i.e. vertical interconnect accesses, are conductors running through multiple PCB layers and electrically connected to PCB transmission lines. A via has a cylindrical-like structure, including a via barrel that is a conductive tube, via pads that connect both ends of the via barrel to other components, i.e. PCB transmission lines, and via antipad (or clearance) that is the clearance hole between the via barrel and the ground plane to which it is not supposed to be connected. At low frequencies, vias have minimal effects on signal transmission. At high frequencies, for example, at Ka band of satellite communication from 20 GHz to 40 GHz, signal loss becomes a considerable problem to overcome for PCB design. Vias not only create impedance discontinuity causing signal reflections, but transmission loss causing signal deterioration.

The transmission loss includes conduction loss and dielectric loss. The conduction loss is primarily due to the resistance in the conduction layer and leakage of charge through the dielectric. The dielectric loss is from the heat dissipation due to the polarization of dipole moments in the dielectric layer subject to the alternating electric field. Both the thickness of the dielectric layer and the length of the vias have an effect on the transmission loss. A thick dielectric layer is helpful for reducing transmission loss, but it also increases the length of via, especially in a multilayer PCB stackup with more than one dielectric layer, which in turn results in increased transmission loss. Thus, a new PCB design is required to offset the elongated effect of vias when thick dielectric layers are employed.

SUMMARY OF THE INVENTION

In accordance with one form of this invention, there is provided a compensated via structure for a multi-layer PCB stackup with improved RF transmission at Ka band of satellite communication, the compensated via structure including a central via; wherein a first end of the central via is connected to an input transmission line within a first layer and a second end of the central via is connected to an output transmission line within a second layer; a plurality of grounding posts surrounding the central via and running through the multi-layer PCB stackup; and a compensating structure contained in a ground plane between the first and second layers, the compensating structure including an antipad through which the central via passes; and wherein the antipad disconnects the central via from the compensating structure.

In accordance with another form of the present invention, there is provided a compensated via structure for a multi-layer PCB stackup with improved RF transmission at Ka band of satellite communication, the compensated via structure including a central via; wherein a first end of the central via is connected to an input transmission line within a first layer and a second end of the central via is connected to an output transmission line within a second layer; a plurality of grounding posts surrounding the central via and running through the multi-layer PCB stackup; and a compensating structure contained in a ground plane between the first and second layers, the compensating structure including an antipad through which the central via passes wherein the antipad disconnects the central via from the compensating structure; and at least one additional antipad through which at least one of the plurality of grounding posts passes wherein the at least one additional antipad disconnects the corresponding ones of the plurality of grounding posts from the compensating structure.

In accordance with another form of the present invention, there is provided a minimized compensated via structure for a multi-layer PCB stackup with improved RF transmission at Ka band of satellite communication, the compensated via structure including a central via; wherein a first end of the central via is connected to an input transmission line within a first layer and a second end of the central via is connected to an output transmission line within a second layer; a plurality of grounding posts surrounding the central via and running through the multi-layer PCB stackup; and a compensating structure contained in a ground plane between the first and second layers, the compensating structure including an antipad through which the central via passes wherein the antipad disconnects the central via from the compensating structure; at least one additional antipad through which at least one of the plurality of grounding posts passes wherein the at least one additional antipad disconnects the corresponding ones of the plurality of grounding posts from the compensating structure; and at least one additional compensating structure contained in at least one additional ground plane between the first and the second layers.

BRIEF DESCRIPTION OF THE DRAWINGS

For a fuller understanding of the nature of the present invention, reference should be made to the following detailed description, taken in conjunction with the accompanying drawings in which.

The detailed embodiments of the present invention will hereinafter be described in conjunction with the appended drawings.

DETAILED DESCRIPTION OF THE PREFERRED EMBODIMENTS

In the present invention, a compensated via structure is utilized in a printed circuit board (PCB) stackup for offsetting the elongated effects of vias running through multiple layers of the PCB. The via structure is composed of a signal via, i.e. a central via, and multiple grounding posts surrounding the central via. Both ends of the central via are connected to the transmission lines within two different layers. The compensating structure is contained in a ground plane between two layers within which the transmission lines are, and disconnects the central via from the compensating structure as well as the ground plane within which the compensating structure is. As a result, the connection of the two layers within which the two transmission lines are is achieved without connection to the middle layer between the two layers, i.e. passing by the middle layer. The compensated via structure increases coupling between the central via and the surrounding grounding posts and thus contributing to improved RF transmission performance.

Figure 1:
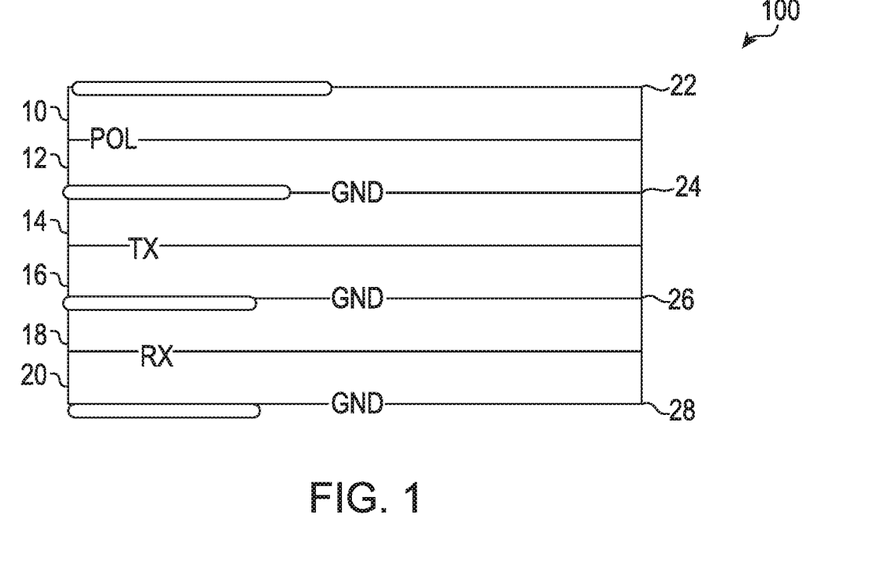
FIG. 1 is a schematic view of a three-layer printed circuit board (PCB) stackup including a polarization (POL) layer, a TX layer and an RX layer, and ground (GND) planes which are on the top and at the bottom of the PCB stack up and between any two adjacent layers.

Referring initially to FIG. 1, an exemplified PCB stackup 100 is shown having a total thickness of around 200 mil. The PCB stackup 100 has three layers: the polarization (POL) layer, the TX layer and the RX layer. The layers are made of specialized materials, e.g. Roger 3035, Roger 3003, for high-frequency transmission. Each layer is a hybrid coupler layer, composed of a couple of sublayers. More specifically, the POL layer is composed of two sublayers 10 and 12; the TX layer is composed of two sublayers 14 and 16; the RX layer is composed of two sublayers 18 and 20. In addition to two ground planes, 22 and 28, on the top and at the bottom of the PCB stackup, there are two ground planes 24 and 26 located between the POL and TX layers and between the TX and RX layers, respectively. The thickness of the ground plane is around 0.7 mil. The thickness of each sublayer is illustrated in FIG. 1: the thicknesses of the sublayers 10 and 12 are 10 mil and 30 mil, respectively; the thicknesses of the sublayers 14 and 16 are 30 mil and 30 mil, respectively; and the thicknesses of the sublayers 18 and 20 are 60 mil and 60 mil, respectively. The illustrated thickness of each sublayer is not limiting, but variable for flexible PCB design, as long as the total thickness is around 200 mil. Both the material and the thickness of each sublayers are selected for purposes of efficient PCB manufacturing, for example, back drilling for the buried vias.

Figure 2:
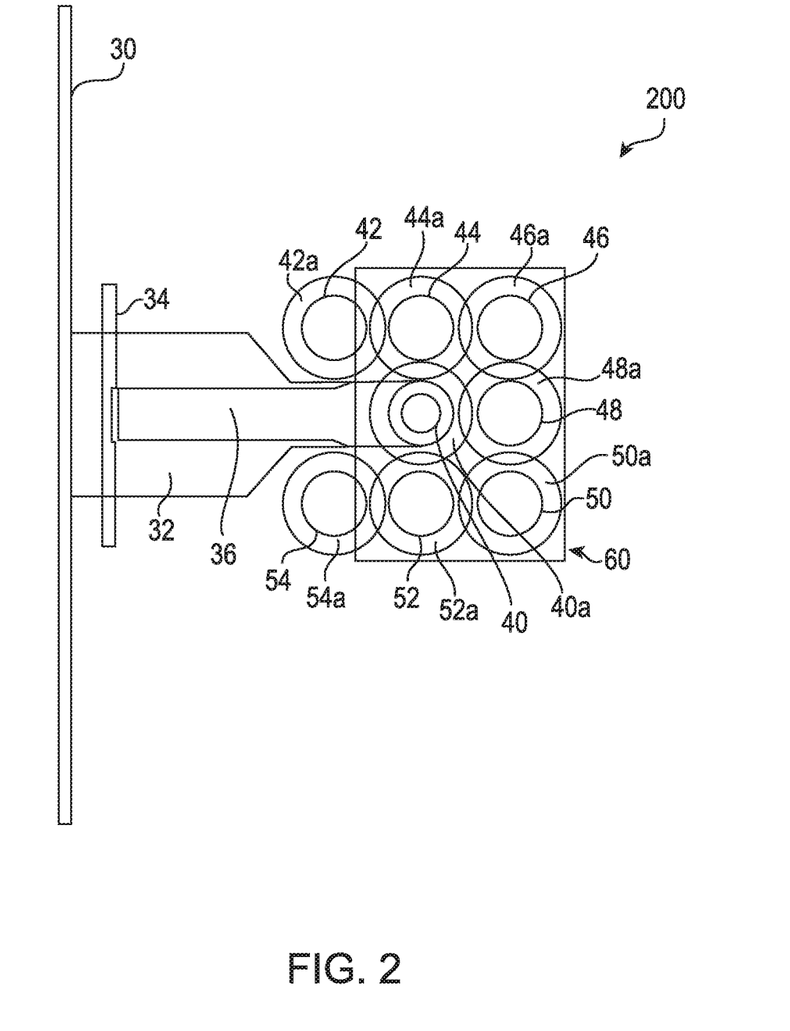
FIG. 2 is an aerial view of the PCB stackup with two transmission lines within two different layers and a built-in compensating structure located on a ground plane between the two layers.

FIG. 2 is an aerial view of the compensated via structure 200 connected to two transmission lines 32 and 36. The two transmission lines, an input transmission line 32 and an output transmission line 36, are connected to two ports, Port 1 (30) and Port 2 (34), respectively. The input transmission line 32 is located within a lower layer, while the output transmission line 36 is located within an upper layer. In one embodiment, the transmission line 32 is within the RX layer between the sublayers 18 and 20. In another embodiment, the transmission line 36 is within the POL layer between the sublayers 10 and 12. The compensated via structure 200 includes a central via 40 and multiple grounding posts surrounding the central via 40. In one embodiment, there are seven grounding posts, 42, 44, 46, 48, 50, 52 and 54, which run through the PCB stackup from top to bottom and surrounding the central via 40. The central via 40 is a buried via: in one embodiment, it runs through two sublayers 12 and 14; in another embodiment, it runs through four sublayers 12, 14, 16 and 18. In the former embodiment, the compensating structure 60 is located on the ground plane, between the POL and the TX layers, i.e. between the sublayers 12 and 14. In the latter embodiment, the compensating structure 60 is located within the TX layer, i.e. between the sublayers 14 and 16. Additional compensating structures 60 may be located on other ground planes, for example, between the sublayers 12 and 14 and/or between the sublayers 16 and 18. Since the central via 40 is a signal via, there is a pad 40a connecting the top end of the central via 40 to the output transmission line 36 and another pad (not shown) connecting the bottom end of the central via 40 to the input transmission line 32.

In one embodiment, the compensating structure 60 contains eight holes through which the central via 40 and seven surrounding grounding posts 42, 44, 46, 48, 50, 52 and 54 pass. The size of the compensating structure 60 varies for optimizing the RF transmission performance of the compensated via structure 200. In a preferred embodiment, the compensating structure 60 contains six holes each of which has a diameter of 36 mil. The diameters of the central via 40 and eight surrounding grounding posts are 20 mil. The central via 40 and five grounding posts 44, 46, 48, 50, and 52 pass through the six holes on the compensating structure 60. Since the diameters of holes on the compensating structure 60 are larger than the diameters of the central via 40 and five surrounding grounding posts, resulting in antipads 44a, 46a, 48a, 50a, and 52a. In the preferred embodiment, the distance between the via barrel, including the central via 40 and five grounding posts, and the inner surface of the holes on the compensating structure 60 is 8 mil. Such a distance can be varied to modulate the capacitance and optimize the RF transmission performance. Additionally, on the ground plane, there are eight antipads for the central via 40 and seven surrounding grounding posts, which disconnect the via structure from the ground plane. As such, the central via 40 connects the input and the output transmission lines 32 and 36 within Rx and POL layers, and passes by the middle layer, TX layer.

Figure 3:
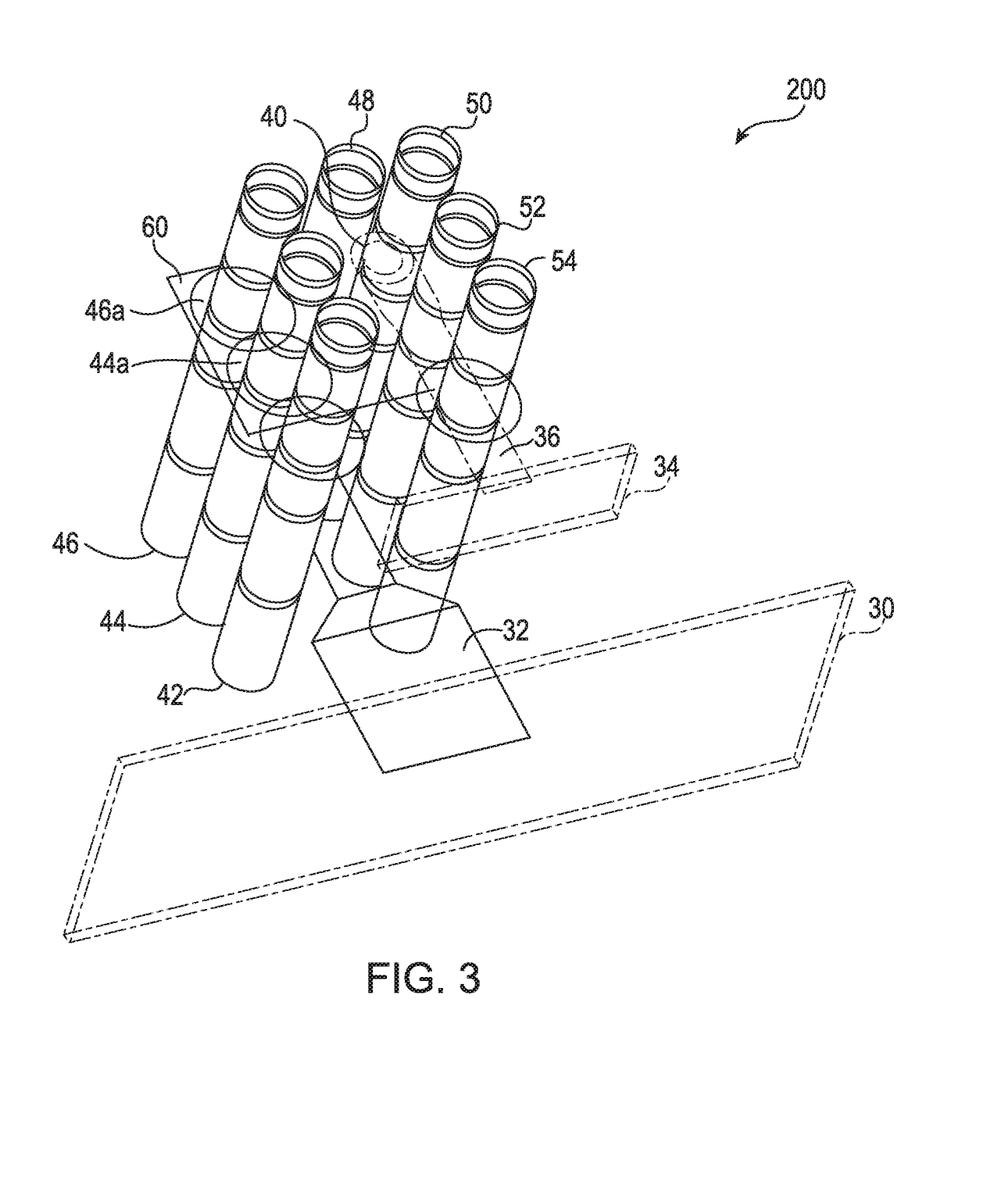
FIG. 3 is a perspective view of the via structure connected to two transmission lines and compensated by the compensating structure.

Referring now to FIG. 3, the compensated via structure 200 is connected to two transmission lines, 32 and 36, and compensated by the compensating structure 60. The compensated via structure 200 includes a central via 40 surrounded by seven grounding posts 42, 44, 46, 48, 50, 52 and 54, which run through from the top to the bottom of the PCB stackup. The central via 40 is a buried via running through at least two sublayers of the PCB stackup: its top is connected to one end of the output transmission line 36 through a pad, and its bottom is connected to one end of the input transmission line 32 through another pad. The other end of the input transmission line 32 is connected to Port 1 (30) and the other end of the output transmission line 36 is connected to Port 2 (34). In one embodiment, the two transmission lines, 30 and 34, are coaxial transmission lines. The compensating structure 60 is contained in a ground plane (not shown) between two layers within which the input and the output transmission lines 32 and 36 are. In one embodiment, the compensating structure 60 has eight holes through which the central via 40 and seven grounding posts 42, 44, 46, 48, 50, 52 and 54 pass. The diameters of those eight holes are larger than the diameters of the central via 40 and the seven grounding posts, thus creating antipads 40a, 42a, 44a, 46a, 48a, 50a, 52a and 54a, for the central via and seven grounding posts. In the other embodiment, the compensating structure 60 has six holes through which the central via 40 and five grounding posts 44, 46, 48, 50, and 52 pass, as shown in FIG. 3. Specifically, antipads 44a and 46a are two holes through which the grounding posts 44 and 46 pass. In another embodiment, there is a second compensating structure (not shown) located on a lower ground plane (not shown) between two layers within which the input and the output transmission lines 32 and 36 are. The second compensating structure contains one hole through which the central via 40 passes. The diameter of the hole on the second compensating structure is larger than the diameter of the central via 40, resulting an antipad which disconnects the central via 40 from the lower ground plane.

Figure 4:
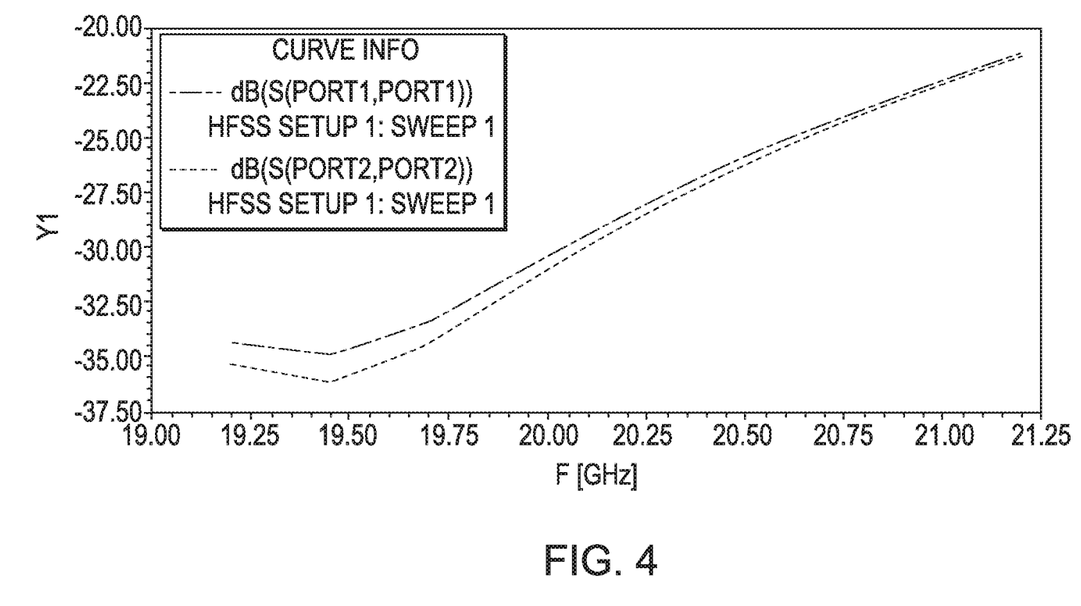
FIG. 4 illustrates the return loss of the compensated via structure over a frequency range from 19.2 GHz to 21.2 GHz when connecting two transmission lines within the POL and RX layers and passing by the middle TX layer.
Figure 6:
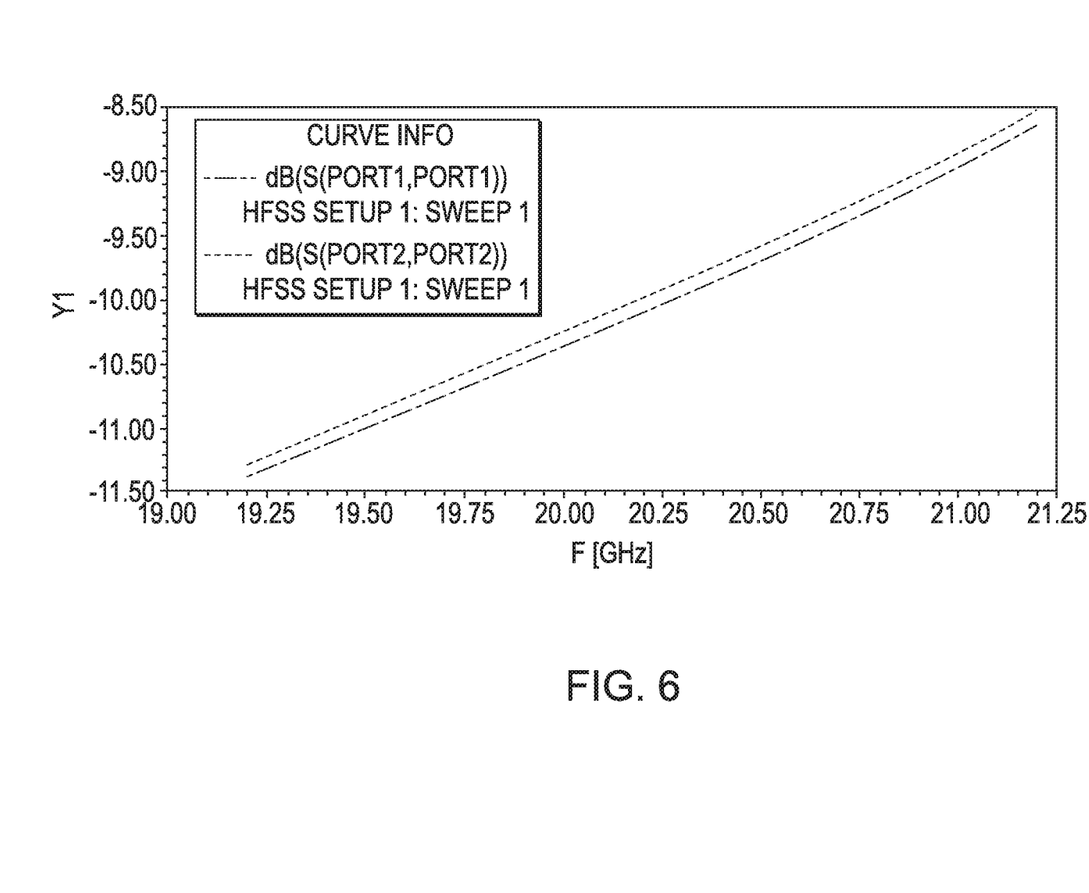
FIG. 6 illustrates the return loss of the uncompensated via structure over a frequency range from 19.2 GHz to 21.2 GHz when connecting two transmission lines within the POL and RX layers and passing by the middle TX layer.

Referring to FIG. 4, the return loss of the compensated via structure 200 is shown over a frequency range from 19.2 GHz to 21.2 GHz when connecting two transmission lines within the POL and RX layers. FIG. 6 illustrates the return loss of the uncompensated via structure over a frequency range from 19.2 GHz to 21.2 GHz when connecting two transmission lines within the POL and RX layers. The return losses are measured on a HFSS simulator. FIG. 6 shows the return loss of the uncompensated via structure for Port 1-Port 1 (30-30) and Port 2-Port 2 (34-34). With an increasing frequency ranging from 19.2 GHz to 21.2 GHz, the return loss of the uncompensated via structure increases from –11.4 dB to –8.6 dB (Port 1-Port 1) and from –11.3 dB to –8.5 dB (Port 2-Port 2), respectively. The return loss for Port 2-Port 2 is slightly higher than that for Port 1-Port 1 over the swept frequency range. FIG. 4 shows the return loss of the compensated via structure 200 for Port 1-Port 1 (30-30) and Port 2-Port 2 (34-34) over the frequency range from 19.2 GHz to 21.2 GHz. At the low frequency end, the return loss of the compensated via structure 200 for Port 1-Port 1 is slightly higher than that for Port 2-Port 2. With an increasing frequency, the return losses for both Port 1-Port 1and Port 2-Port 2 decreases a little bit from 19.2 GHz and then starts increasing at 19.45 GHz and finally reaches an almost same value, –21.25 dB, at 21.2 GHz. A comparison of FIG. 4 and FIG. 6 shows that the return loss decreases from –10.4 dB to –30.1 dB for Port 1-Port 1 at 20 GHz. Such a significant reduction in the return loss is due to the increased coupling between the central via 40 and the surrounding grounding posts and renders improved transmission performance in GHz frequency range.

Figure 5:
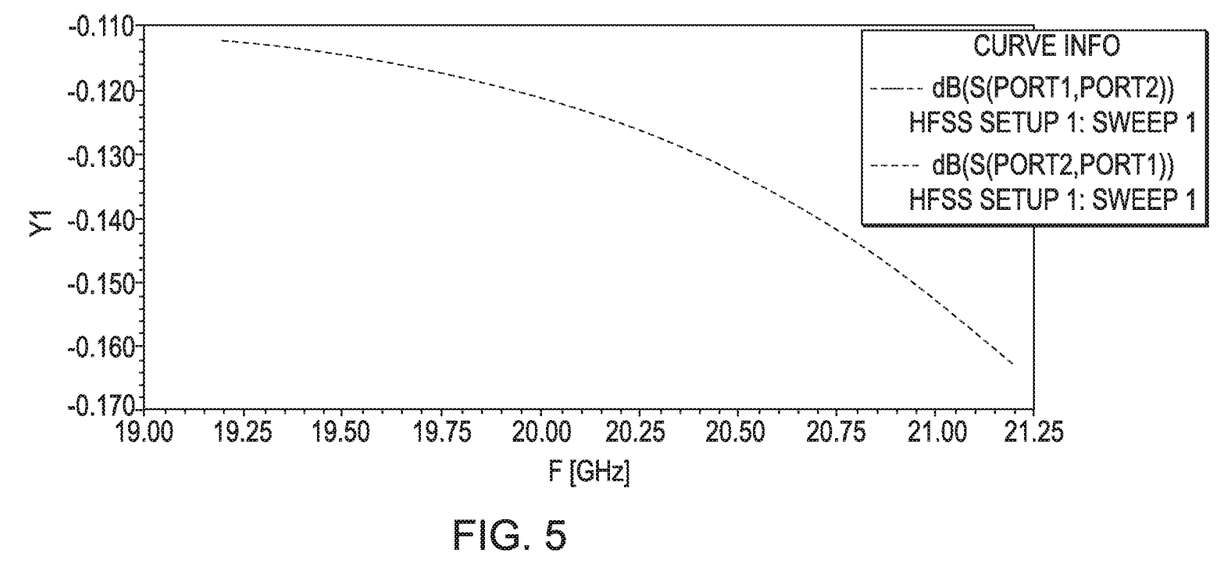
FIG. 5 illustrates the insertion loss of the compensated via structure over a frequency range from 19.2 GHz to 21.2 GHz when connecting two transmission lines within the POL and RX layers and passing by the middle TX layer.
Figure 7:
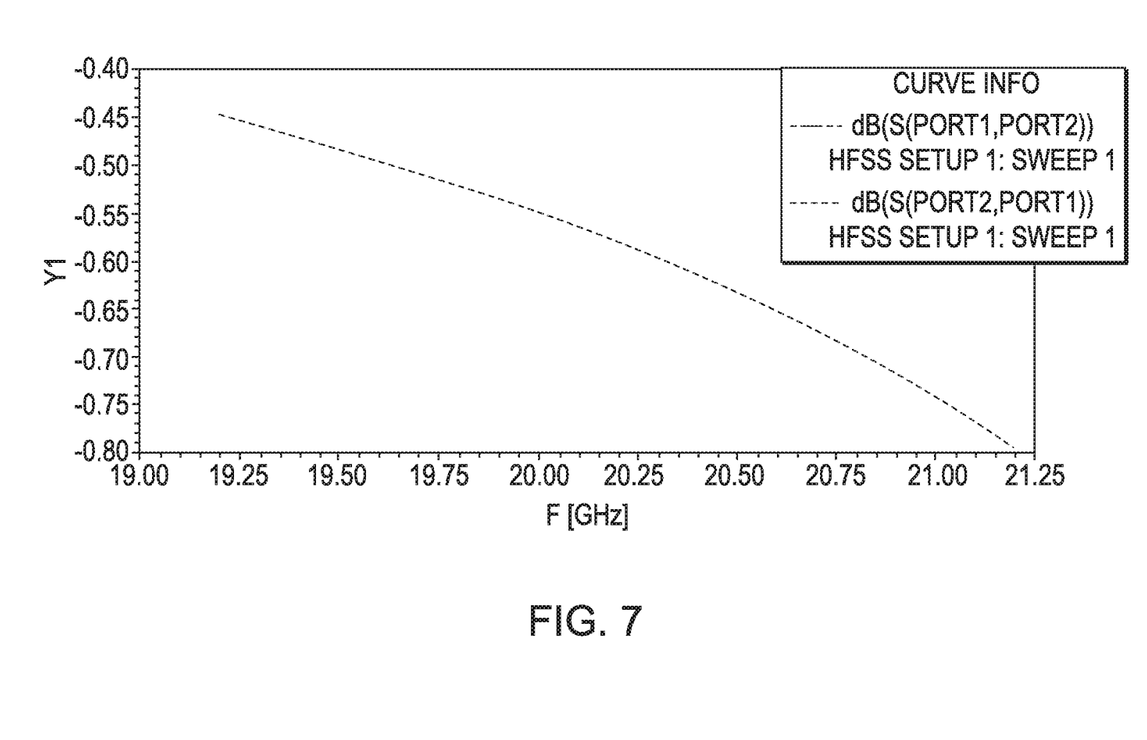
FIG. 7 illustrates the insertion loss of the uncompensated via structure over a frequency range from 19.2 GHz to 21.2 GHz when connecting two transmission lines within the POL and RX layers and passing by the middle TX layer.

FIG. 5 illustrates the insertion loss of the compensated via structure 200 over a frequency range from 19.2 GHz to 21.2 GHz when connecting two transmission lines within the POL and the RX layers. FIG. 7 illustrates the insertion loss of the uncompensated via structure over a frequency range from 19.2 GHz to 21.2 GHz when connecting two transmission lines within the POL and RX layers. The insertion losses are measured on a HFSS simulator. FIG. 7 shows the insertion loss of the uncompensated via structure for Port 1-Port 2 (30-34) and Port 2-Port 1 (34-30). The insertion losses for both Port 1-Port 2 (30-34) and Port 2-Port 1 (34-30) are the same over the frequency range 19.2 GHz to 21.2 GHz. With an increasing frequency, the insertion loss of the uncompensated via structure decreases from –0.45 dB to –0.8 dB. FIG. 5 shows the insertion loss of the compensated via structure 200, and the insertion losses for both Port 1-Port 2 (30-34) and Port 2-Port 1 (34-30) are the same over the frequency range from 19.2 GHz to 21.2 GHz. With an increasing frequency, the insertion loss of the compensated via structure 200 decreases from –0.112 dB to –0.164 dB. A comparison of FIG. 5 and FIG. 7 shows a significant reduction in the insertion loss decreasing from –0.55 dB to –0.122 dB at 20 GHz.

Figure 8:
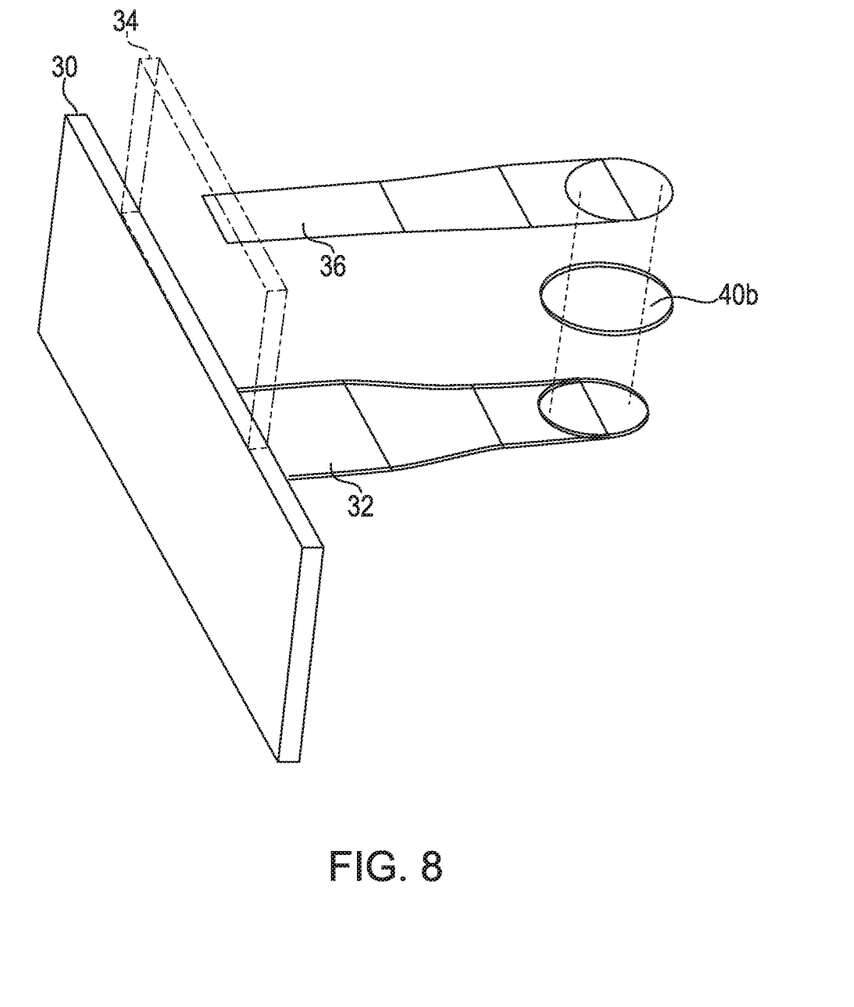
FIG. 8 is a perspective view of a minimized compensated structure for a signal via (not shown) which is connected to two transmission lines through pads and disconnected from the compensating structure through an antipad.

FIG. 8 shows another embodiment of a minimized compensated via structure (not shown) having an anitipad 40b through which the central via 40 passes. In the embodiment depicted in FIG. 8, the input transmission line 32 and the output transmission line 36 are located on a lower layer and an upper layer, respectively. Within the lower layer, one end of the input transmission line 32 is connected to Port 1 (30) and the other end is connected to the central via 40 through a pad. Within the upper layer, one end of the output transmission line 36 is connected to Port 2 (34) and the other end is connected to the central via 40 through a pad. The minimized compensated via structure is contained in a ground plane which is located between the upper and the lower layers. The minimized compensated via structure contains a hole, which has a diameter larger than that of the central via 40, resulting in an antipad 40b that disconnects the central via 40 from the minimized compensated via structure as well as the ground plane containing the minimized compensated via structure. In one embodiment, the output transmission line 36 has a width of 24 mil at the end connected to the Port 2 (34), and the pad connecting the output transmission line 36 and the central via 40 has a diameter of 36 mil. Thus, the output transmission line has a "neckdown" structure that the width decreases from 36 mil to 24 mil running from the central via 40 to the Port 2 (34). In the other embodiment, the input transmission line 32 a "neckdown" structure narrowing from the Port 1 (30) to the central via 40 along the transmission line.

Numerous parameters related to the sizes and lengths of the central via, the grounding posts, pads, antipads, etc. have impacts on the RF transmission performance of the compensated via structure. These parameters include, but are not limited to:

(1) The diameters of the central via and the surrounding grounding posts;
(2) The number and proximity of the grounding posts surrounding the central via;
(3) The lengths of the central via and the grounding posts;
(4) The diameters of the pads that connect the transmission lines to the central via;
(5) The diameter of the antipad that disconnects the central via from the compensating structure;
(6) The diameters of the antipads that disconnect the grounding posts from the compensating structure;
(7) The width and length of the transmission lines, including but not limited to, the physical feature of "neck down" structure of the input and output transmission lines;

(8) The thickness and dielectric constant of each layer of the multi-layer PCB stackup. The thicker the layer is, the more compensating effect does on the RF transmission performance.

While the present invention has been shown and described in accordance with several preferred and practical embodiments, it is recognized that departures from the instant disclosure are contemplated within the spirit and scope of the present invention.

What is claimed is:

1. A compensated via structure for a multi-layer PCB stackup with improved RF transmission at Ka band of satellite communication, the compensated via structure comprising:
    a central via;
        wherein a first end of the central via is connected to an input transmission line within a first layer and a second end of the central via is connected to an output transmission line within a second layer;
        a plurality of grounding posts surrounding the central via and running through the multi-layer PCB stackup; and
        a compensating structure contained in a ground plane between the first and the second layers, the compensating structure comprising:
            an antipad through which the central via passes wherein the antipad disconnects the central via from the compensating structure; and
    at least one additional antipad through which at least one of the plurality of grounding posts passes wherein the at least one additional antipad disconnects the corresponding ones of the plurality of grounding posts from the compensating structure.

2. The compensated via structure for a multi-layer PCB stackup as recited in claim 1, wherein the central via is electronically connected to the input transmission line through a first pad.

3. The compensated via structure for a multi-layer PCB stackup as recited in claim 1, wherein the central via is electronically connected to the output transmission line through a second pad.

4. The compensated via structure for a multi-layer PCB stackup as recited in claim 1, wherein the diameter and the length of the central via are adjustable for optimized RF transmission performance.

5. The compensated via structure for a multi-layer PCB stackup as recited in claim 1, wherein the diameters and the lengths of the plurality of grounding posts are adjustable for optimized RF transmission performance.

6. The compensated via structure for a multi-layer PCB stackup as recited in claim 1, wherein the proximity and the configuration of the plurality of grounding posts to the central via are adjustable for optimized RF transmission performance.

7. The compensated via structure for a multi-layer PCB stackup as recited in claim 1, wherein the antipad that disconnects the central via and the additional antipads that disconnect the plurality of grounding posts from the compensating structure are adjustable for optimized RF transmission performance.

8. The compensated via structure for a multi-layer PCB stackup as recited in claim 1, wherein the input transmission line has a "neck down" structure.

9. The compensated via structure for a multi-layer PCB stackup as recited in claim 8, wherein the size and the lengths of the input transmission line are adjustable for optimized RF transmission performance.

10. The compensated via structure for a multi-layer PCB stackup as recited in claim 1 wherein the output transmission line has a "neck down" structure.

11. The compensated via structure for a multi-layer PCB stackup as recited in claim 10, wherein the size and the lengths of the output transmission line are adjustable for optimized RF transmission performance.

12. The compensated via structure for a multi-layer PCB stackup as recited in claim 1, wherein the thickness and the dielectric constant of each of the PCB stackup layers are adjustable for optimized RF transmission performance.

* * * * *